US006914198B2

(12) United States Patent
Akram et al.

(10) Patent No.: US 6,914,198 B2
(45) Date of Patent: Jul. 5, 2005

(54) ELECTRICAL DEVICE ALLOWING FOR INCREASED DEVICE DENSITIES

(75) Inventors: Salman Akram, Boise, ID (US); Warren M. Farnworth, Nampa, ID (US); Alan G. Wood, Boise, ID (US); J. Michael Brooks, Caldwell, ID (US); Eugene H. Cloud, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/237,579

(22) Filed: Sep. 9, 2002

(65) Prior Publication Data

US 2003/0031000 A1 Feb. 13, 2003

Related U.S. Application Data

(62) Division of application No. 09/205,796, filed on Dec. 4, 1998, now Pat. No. 6,535,393.

(51) Int. Cl.[7] .............................................. H05K 1/18
(52) U.S. Cl. ...................... 174/260; 361/769; 361/779; 257/783
(58) Field of Search ............................. 174/52.2, 52.3, 174/52.4, 138 E, 138 G, 259, 260, 267; 257/684, 696, 671, 690, 692, 693, 783, 735; 361/760, 769, 779, 783

(56) References Cited

U.S. PATENT DOCUMENTS

| 4,635,354 | A | * | 1/1987 | Chrobak et al. ............... 29/622 |
| 4,749,120 | A | | 6/1988 | Hatada |
| 4,794,446 | A | * | 12/1988 | Hamano ..................... 257/696 |
| 5,067,007 | A | | 11/1991 | Kanji et al. |
| 5,237,130 | A | | 8/1993 | Kulesza et al. |
| 5,261,156 | A | | 11/1993 | Mase et al. |
| 5,268,331 | A | * | 12/1993 | Abbott ....................... 427/569 |

(Continued)

OTHER PUBLICATIONS

Definitions of "Resilience" on the Web (found on the GOOGLE seach engine): 3 pages with the pertinent definitions underlined and marked by an asterisk.*

Data sheet for "HYSOL FP4323."

George Odian, "Principles of Polymerization" (3d ed. 1991), pp. 29, 31, 32, 34.

*Primary Examiner*—John B. Vigushin
(74) *Attorney, Agent, or Firm*—Kirkpatrick & Lockhart Nicholson Graham LLP

(57) ABSTRACT

Disclosed is a device comprising a circuit having an active side and a non-active side, a package enclosing the active side of the circuit and not enclosing a portion of the non-active side of the circuit, and a lead having a first end connected to the active side of the circuit via a lead-over-chip connection, and having a second end extending from the package. Also disclosed is a device comprising a circuit and a lead formed from a flexible conductor, with the lead having a first end connected to the circuit.

10 Claims, 4 Drawing Sheets

U.S. PATENT DOCUMENTS

| | | | | |
|---|---|---|---|---|
| 5,281,851 A | * | 1/1994 | Mills et al. | 257/670 |
| 5,296,736 A | | 3/1994 | Frei et al. | |
| 5,305,179 A | | 4/1994 | Sono et al. | |
| 5,313,368 A | * | 5/1994 | Volz et al. | 361/774 |
| 5,391,915 A | * | 2/1995 | Mukai et al. | 257/643 |
| 5,469,333 A | | 11/1995 | Ellerson et al. | |
| 5,471,097 A | * | 11/1995 | Shibata | 257/787 |
| 5,475,259 A | * | 12/1995 | Kasai et al. | 257/692 |
| 5,491,362 A | | 2/1996 | Hamzedoost et al. | |
| 5,495,667 A | | 3/1996 | Farnworth et al. | |
| 5,525,547 A | * | 6/1996 | Matsunaga et al. | 29/827 |
| 5,572,066 A | * | 11/1996 | Safai et al. | 257/666 |
| 5,583,370 A | * | 12/1996 | Higgins et al. | 257/667 |
| 5,583,375 A | * | 12/1996 | Tsubosaki et al. | 257/692 |
| 5,616,962 A | | 4/1997 | Ishikawa et al. | |
| 5,622,590 A | | 4/1997 | Kunitomo et al. | |
| 5,680,057 A | * | 10/1997 | Johnson | 324/757 |
| 5,687,474 A | | 11/1997 | Hamzedoost et al. | |
| 5,697,148 A | | 12/1997 | Lance, Jr. et al. | |
| 5,714,252 A | | 2/1998 | Hogerton et al. | |
| 5,786,985 A | | 7/1998 | Taniguchi et al. | |
| 5,843,251 A | | 12/1998 | Tsukagoshi et al. | |
| 5,874,780 A | | 2/1999 | Murakami | |
| 5,894,108 A | * | 4/1999 | Mostafazadeh et al. | 174/52.4 |
| 6,046,910 A | | 4/2000 | Ghaem et al. | |
| 6,094,356 A | * | 7/2000 | Fujisawa et al. | 361/773 |
| 6,151,221 A | | 11/2000 | Van Lerberghe | |
| 6,208,023 B1 | * | 3/2001 | Nakayama et al. | 257/696 |
| 6,320,247 B2 | * | 11/2001 | Sakamoto | 257/666 |
| 6,403,226 B1 | * | 6/2002 | Biernath et al. | 428/447 |
| 6,528,867 B1 | * | 3/2003 | Ahmad | 257/666 |

* cited by examiner

ELECTRICAL DEVICE ALLOWING FOR INCREASED DEVICE DENSITIES

CROSS REFERENCE TO RELATED APPLICATIONS

This application is a divisional of U.S. application Ser. No. 09/205,796, filed Dec. 4, 1998, now U.S. Pat. No. 6,535,393. This application is also related to co-pending U.S. patent application Ser. No. 10/237,645, filed Sep. 9, 2002 and co-pending U.S. patent application Ser. No. 10/301,990, filed Nov. 22, 2002.

BACKGROUND OF THE INVENTION

1. Field of the Invention

The present invention is directed to a device that can be made smaller and with improved electrical characteristics than prior art devices and, more particularly, to a semiconductor device that can be made with a package that allows for greater device densities on circuit boards, shorter lead lengths, more tolerance to non-uniformities, and improved cooling.

2. Description of the Background

Electronic products typically contain a large number of electrical devices organized on one or more substrates, also known as circuit boards. The efficient packaging of those devices is an important factor in the product's performance. One way to improve performance is to increase the density of electrical devices on the substrate. For example, density may be increased by decreasing the size of the devices, thereby increasing the number of devices that can be placed on a given substrate.

One way to increase device density is to use vertical packaging, which places devices perpendicular to the substrate. Vertical packaging allows for many more devices to be placed on a substrate because vertically oriented devices have smaller footprints than horizontally oriented devices. However, vertical packaging is subject to package instability (i.e. tipping over), particularly during processing steps involving poor adhesion between the device and the substrate, such as solder reflow. That stability is caused, in part, by non-uniformities in both the substrate and device. As a result, vertical packaging requires additional steps to create more uniform devices and substrates, and to stabilize the devices during some processing steps.

Conventional devices and substrates also suffer from other problems caused by non-uniformities. For example, bending of device leads and poor contact between the device and substrate may result if the device and substrate are not uniform. Such problems require that device leads be lengthened to allow for greater flexibility to compensate for the non-uniformities. Longer leads, however, may result in the lead bending and possibly creating a short between conductors on the substrate. In addition, longer leads may cause detrimental electrical characteristics, such as increased resistance, increased capacitance, and decreased speed. Furthermore, longer leads tend to increase instability problems when there is poor adhesion between the device and the substrate.

Thus, a need exists for an improved device to allow for increased device densities without the deficiencies of the prior art.

BRIEF SUMMARY OF THE INVENTION

The present invention is also directed to a device comprising a circuit and from a flexible conductor, with the lead having a first end connected to the circuit.

The present invention solves the shortcomings of the prior art by providing for higher device densities, shorter lead lengths, and more tolerance of non-uniformities, such as those in devices and substrates. Those and other advantages and benefits of the present invention will become apparent from the description of the invention provided hereinbelow.

BRIEF DESCRIPTION OF THE SEVERAL VIEWS OF THE DRAWING

For the present invention to be clearly understood and readily practiced, the present invention will be described in conjunction with the following figures wherein.

DETAILED DESCRIPTION OF THE INVENTION

It is to be understood that the description of the invention has been simplified to illustrate aspects that are relevant for a clear understanding of the present invention, while eliminating, for the purpose of clarity, other elements. Those of ordinary skill in the art will recognize that other elements may be desired and/or required.

Figure 1:
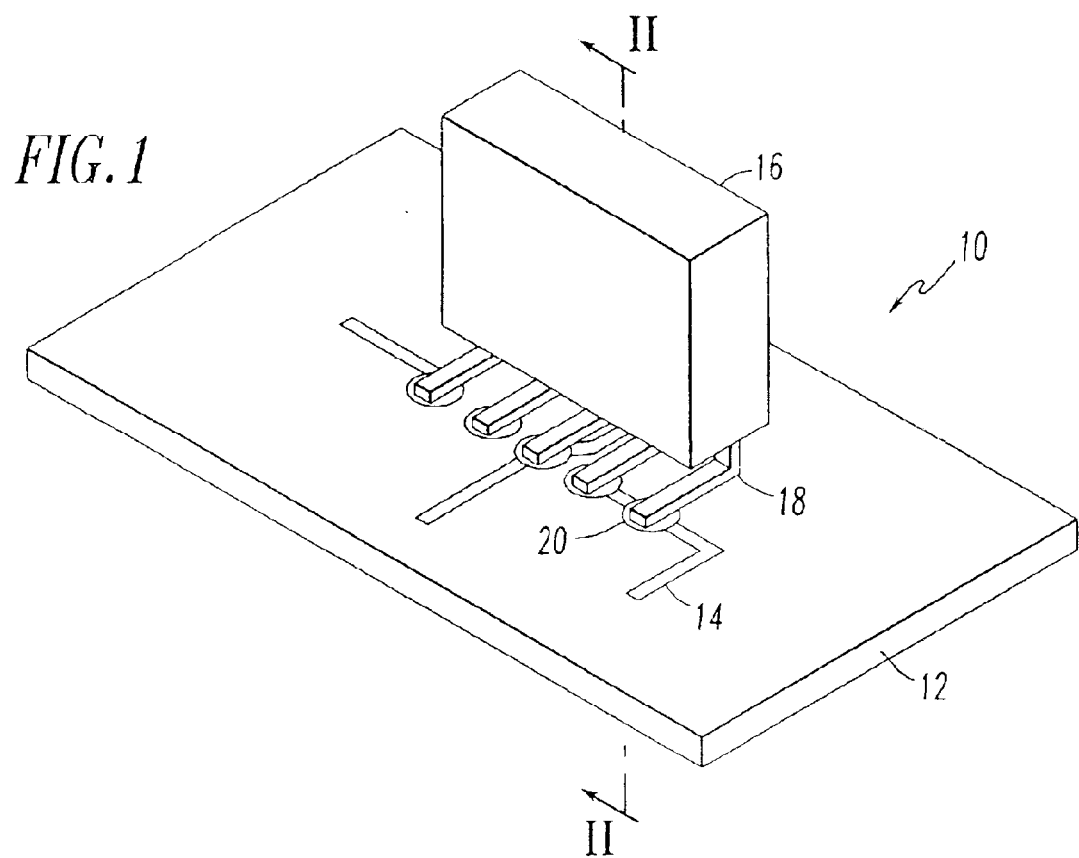
FIG. 1 is a perspective view of a circuit board including a substrate, a device, and a deformable structure between the circuit and conductive paths on the FIG. 2 is a cross-sectional view along line II—II of the circuit board illustrated in FIG. 1.

FIG. 1 is a perspective view of a circuit board 10 including a substrate 12, such as a circuit board, having conductive paths 14 for transmitting signals, a device 16 having leads 18 for transmitting signals to and from the device 16, and a deformable structure 20 connecting the substrate 12 to the device 16.

The device 16 may be an integrated circuit, a discrete component, or any other device that is connected to a substrate. In one embodiment of the present invention, the device 16 is a memory device. In that embodiment, the device may be dynamic memory or static memory. The leads 18 of the device 16 may be for surface mount connection to the substrate 12.

The deformable structures 20 connect the substrate 12 to the device 16. In the present embodiment, the deformable structures 20 connect the conductive paths 14 of the substrate 12 to the leads 18 of the device 16. The deformable structures 20 may be connected to the substrate 12 and the device 16 with conductive or non-conductive adhesives. Alternatively, the deformable structures 20 may themselves be adhesive so the additional adhesive is not required.

The deformable structures 20 may be of a number of types and shapes. For example, the deformable structure may be of a structure for connecting a single lead 18 to a single conductive path 14, as illustrated in FIG. 1. In that embodiment, the deformable structures 20 may be located at discrete locations on the substrate 12, such as at places where leads 18 connect to conductive paths 14. Alternatively, a single deformable structures 20 may connect several leads 18 to several conductive paths 14, as described in more detail hereinbelow with respect to FIGS. 3 and 4. The deformable structures 20 may be placed at each location on the substrate 12 where the leads 18 connect to conductive paths 14. Alternatively, the deformable structures 20 may be selectively placed at locations where non-uniformities are likely to exist. Thus, there may be as one deformable structure 20, or as many deformable structures 20 as there are leads 18.

The deformable structures 20 may be compressed between the leads 18 and the substrate 12. That ability to be compressed compensates for non-uniformities that may exist, such as in the substrate 12, the conductive paths 14, the device 16, and the leads 18. That compensation reduces or eliminates bending of the leads 18 and poor the contact between the leads 18 and the conductive paths 14 that would otherwise be caused by the non-uniformities. Furthermore, the deformable structures 20 eliminate the need to lengthen the leads 18, thereby allowing for shorter leads 16, shorter signal paths, and increased performance. Shortening the leads 18 also reduces or eliminates the risk of surface mount leads rubbing the bottom of the device 16 or rubbing the substrate 12, thereby reducing the risk of short circuits.

The deformable structures 20 may be any of several different materials. For example, the deformable structures 20 may be a polymer, such as silicone. The deformable structures 20 may also be resilient, such as when formed from elastomers, although the deformable structures 20 do not necessarily have to be resilient. The deformable structure 20 may be conductive or non-conductive, depending on the particular application.

Figure 2:
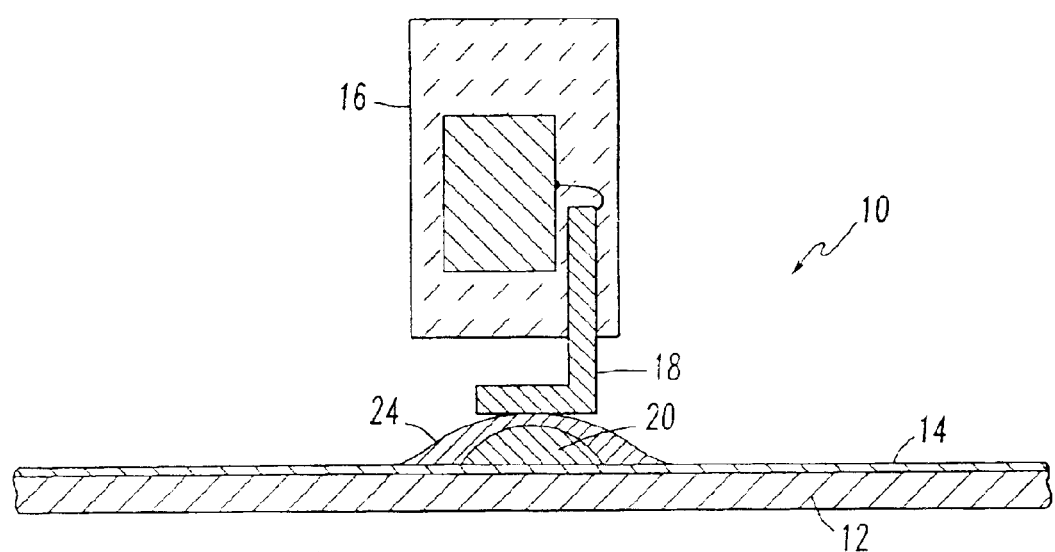

FIG. 2 is a cross-sectional view along line II—II of the circuit board illustrated in FIG. 1. A conductor 24 may be disposed over the deformable structure 20 and in contact with both the leads 18 and the conductive paths 14. The conductor 24 may be, for example, a conductive adhesive or a conductive tape used to secure the leads 18 to the deformable structures 20. The conductor 24 may be applied on individual deformable structures to provide an electrical connection between one lead 18 and one conductive path 14. Alternatively, the conductor 24 may be applied across several deformable structures 20 where an electrical connection is desired between several leads and/or several conductive paths 14.

The conductor 24 may be eliminated if connection between the leads 18 and the conductive paths 14 are not desired, such as if the leads 18 are only needed to support the device 16. The conductor 24 may also be eliminated if the deformable structures 20 are conductive. In one embodiment, the deformable structures 20 are both conductive and adhesive, thereby eliminating the need for additional adhesives and conductors, but still providing electrical connection between the leads 18 and the conductive paths 14.

Figure 3:
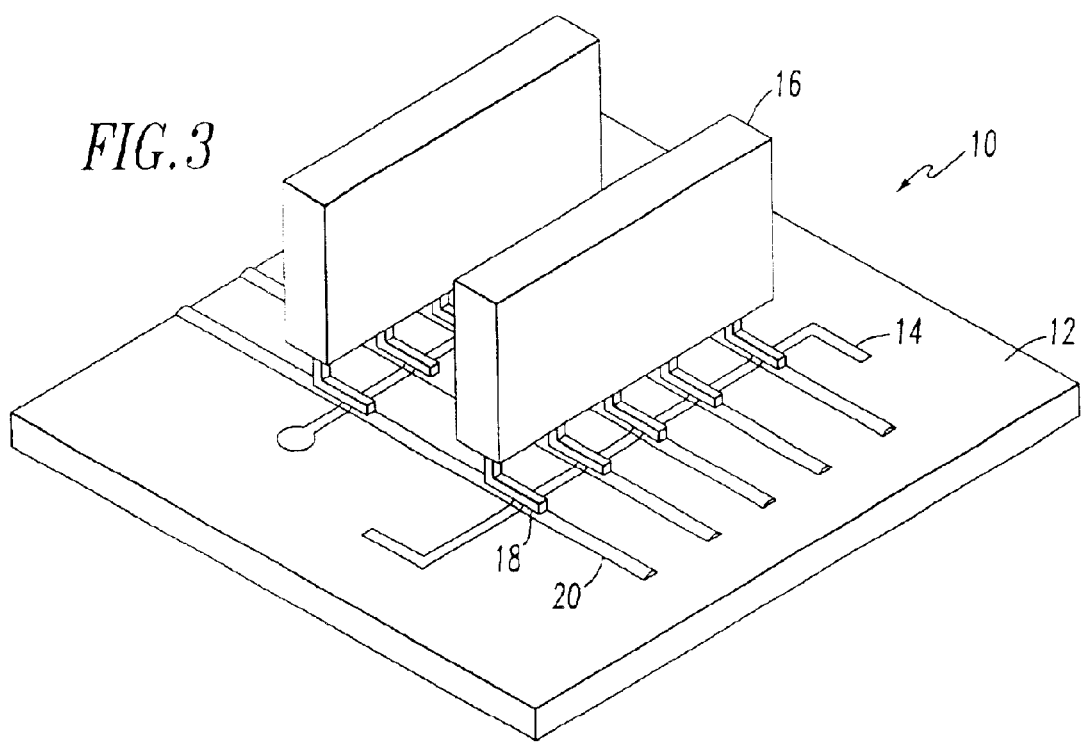
FIG. 3 is a perspective view of a circuit board including deformable structures in elongated form on the substrate.

FIG. 3 is a perspective view of a circuit board 10 including deformable structures 20 in elongated form on the substrate 12. The deformable structures 20 may extend over part or all of the substrate 12. The deformable structures 20 may be non-conductive so that any one of the deformable structures 20 may contact several conductive paths 14 and several leads 18 but not cause a short circuit. In that embodiment, conductors 24 may be used to electrically connect individual leads 18 to individual conductive paths 14, as discussed hereinabove.

Figure 4:
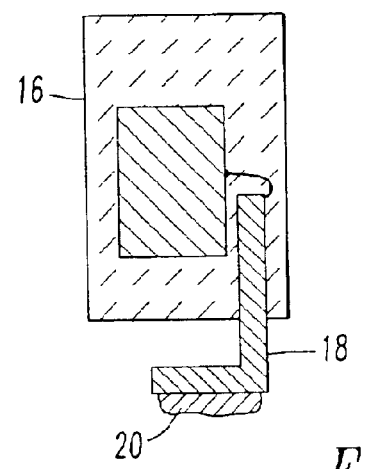
FIG. 4 is a cross-sectional view of a device including a deformable structure attached to leads of the device.

FIG. 4 is a cross-sectional view of a device 16 including deformable structures 20 attached to the leads 18. In that embodiment, the deformable structures 20 may be attached to the leads 18 of the device 16 prior to connecting the device 16 to the substrate 12. As described hereinabove, the deformable structures 20 may be adhesives, or adhesives may be used to attach the deformable structures 20 to the leads 18.

Figure 5:
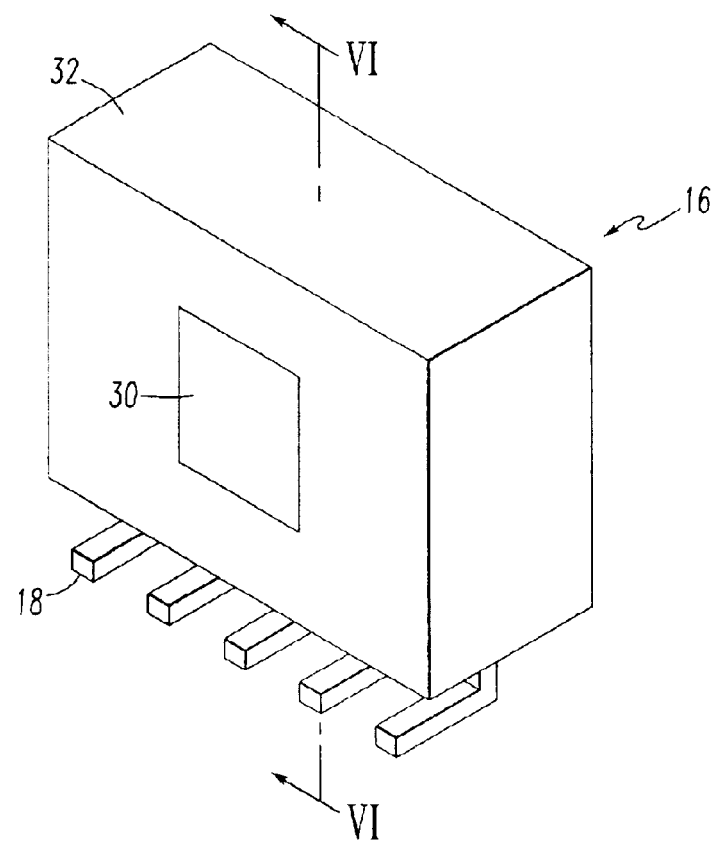
FIG. 5 is a perspective view of a device including an integrated circuit partially enclosed in a package.

FIG. 5 is a perspective view of a device 16 including an integrated circuit 30 partially enclosed by a package 32, and leads 18 extending from the package 32. The device 16 may be, for example, an application specific integrated circuit or a memory device. The device 16 illustrated in FIG. 5, as well as the devices 16 described herein below with respect to FIGS. 6–9, may be used with or without the deformable structures 20. If the device 16 is used without the deformable structures 20, it may be applied directly to flex tape or conductive traces on a substrate 12.

Figure 6:
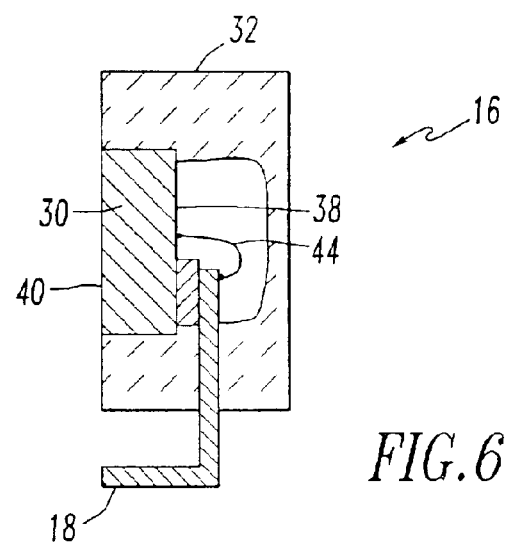
FIG. 6 is a cross-sectional view along line VI—VI of the device illustrated in FIG. 5.

FIG. 6 is a cross-sectional view along line VI—VI of the device 16 illustrated in FIG. 5. The integrated circuit 30 has an active area 38 including electrically conductive connections to logic gates in the integrated circuit 30. The integrated circuit 30 also includes a non-active area 40 which does not contain electrically conductive connections to logic gates forming the integrated circuit 30.

The package 32 encloses the active area 38 of the integrated circuit 30, as is conventionally done, but does not enclose a portion of the non-active area 40. The non-enclosed portion of the non-active area 40 is exposed to ambient environment. Exposing a portion of the non-active area 40 of the integrated circuit 30 facilitates cooling of the integrated circuit 30. In addition, exposing a portion of the integrated circuit 30 allows for a smaller profile of the device 16, because the package 32 is thinner, thereby allowing for increased density of devices 16 on a circuit board.

The leads 18 may be connected to the active area 38 of the integrated circuit 30 with lead bonds 44 in a lead-over-chip manner. A lead-over-chip design offers an advantage of making connections near the center of the integrated circuit 30, as opposed to near the edge of the integrated circuit 30. As a result, the edge of the active area 38 of the integrated circuit 30 may be engaged by the package 32 to more securely hold the integrated circuit 30. Alternatively, the leads 18 may also be connected to the integrated circuit 30 using a design other than lead-over-chip. Two such examples are tab bonding and peripheral bond pads that provide for sufficient space near the edge of the integrated circuit 30 to allow for engagement by the package 32. Furthermore, the integrated circuit 30 may be engaged by the package 32 at only the sides, without engaging the active area 38.

Figure 7:
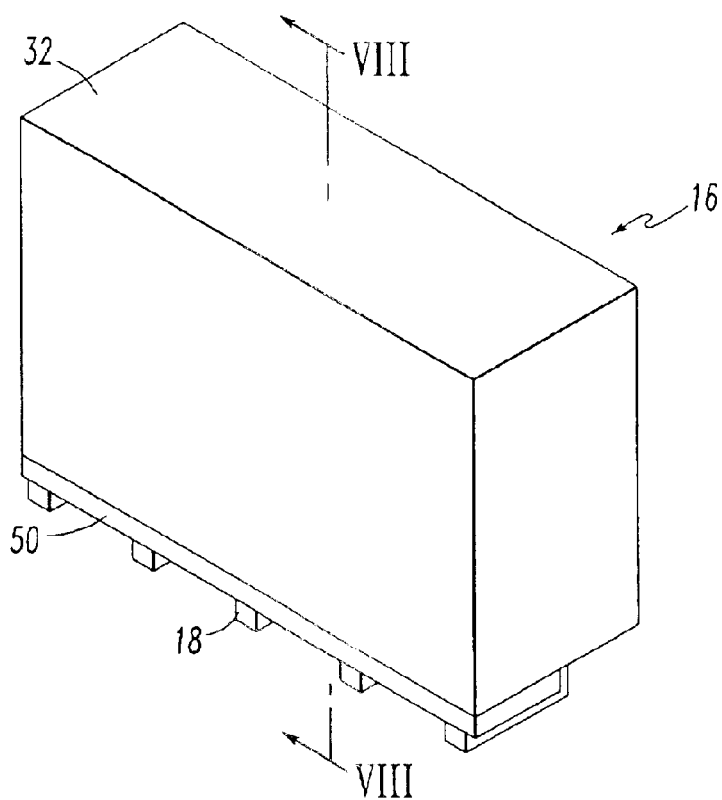
FIG. 7 is a perspective view of a device including leads formed from tab-tape.

FIG. 7 is a perspective view of a device 16 including leads 18 formed from a flexible conductor adhesive, such as tab-tape. A portion of the leads 18 may be attached to the package 32 with the adhesive. For example, the leads 18 may be attached to the outside of the package 32 from a point where the leads 18 exit the package to a point where the leads 18 are to be attached to another structure, such as a substrate. The leads 18 in that embodiment may be used with the deformable structures 20 described hereinabove, and may also be used with exposed integrated circuit 30 described hereinabove.

Figure 8:
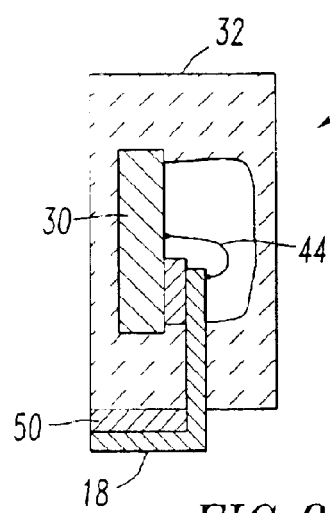
FIG. 8 is a cross-sectional view along line VIII—VIII of the device illustrated in FIG. 7.

FIG. 8 is a cross-sectional view along line VIII—VIII of the device 16 illustrated in FIG. 6. A spacer 50 may be used so that the leads 18 are away from the package 32, thereby reducing the risk of the package 32 contacting the substrate 12. The spacer 50 may be made of the same materials as the deformable structure 20 described hereinabove with respect to FIGS. 1–4, so that the spacer 50 compensates for non-uniformities, such as on the substrate 12. The spacer 50 may also be a dielectric so as to insulate signals on the leads 18.

Figure 9:
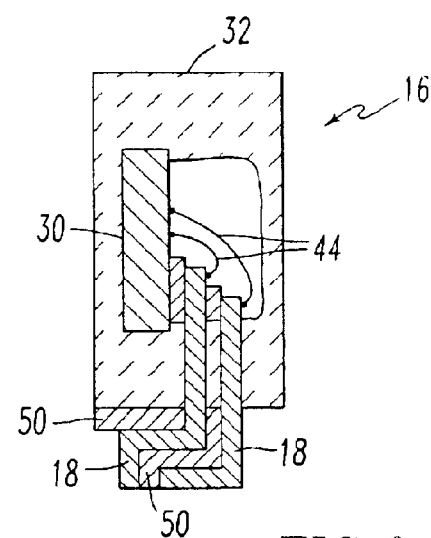
FIG. 9 is a cross-sectional view of a device including leads formed from multiple layered tab-tape.

FIG. 9 is a cross-sectional view of a device 16 having leads 18 formed from multiple layers of tab-tape. That embodiment allows for increased lead density. An additional spacer 50 may be placed between leads 18 to prevent a short between the leads 18. The spacer 50 may be made of the same materials as the deformable structure 20 discussed hereinabove with respect to FIGS. 1–4, so that the spacer 50 compensates for non-uniformities, such as on the substrate 12. The spacer 50 may be a dielectric so as to insulate signals on the leads 18.

FIG. 9 is a cross-sectional view of a device 16 having leads 18 formed from multiple layers of tab-tape. That embodiment allows for increased lead density. An additional spacer 50 may be placed between leads 18 to prevent a short between the leads 18. The spacer 50 may be made of the same materials as the deformable structure 20 discussed hereinabove with respect to FIGS. 1–4, so that the spacer 50 compensates for non-uniformities, such as on the substrate 12. The spacer 50 may be a dielectric so as to insulate signals on the leads 18.

The present invention as described herein may be used with or without L-shaped leads. When the present invention is used with L-shaped leads, the risk that the base of such leads will rub the bottom of the package, even when the exposed portion of the L is minimized, is greatly reduced. The present invention also provides for the use of new, varied lead types, such as tape leads. These tape leads may be used in an over/under configuration, enhancing the number of interconnect points available within the area covered by the IC package on the substrate. The use of non-standard lead configurations connected via an LOC method enables the exposure of one face of a die within the package, greatly enhancing thermal properties.

The present invention has been described in connection with the preferred embodiments thereof. Those of ordinary skill in the art will recognize that many modifications and variations may be employed. For example, the embodiments illustrated in FIGS. 5–9 may be used either with or without the deformable structures 20 described with respect to FIGS. 1–4. All such modifications and variations are intended to be covered by the foregoing description and the following claims.

What is claimed is:

1. A device comprising;
    a circuit;
    a package enclosing said circuit;
    a first lead formed from a flexible conductor and an adhesive, said first lead having a first end connected to said circuit, having a portion connected to said package, and having a second end extending from said package and attached to a substrate; and
    a spacer positioned between said package and said first lead, said spacer including an adhesive and a resiliently deformable structure in contact with said package and said substrate.

2. The device of claim 1, further comprising at least a second lead formed from a flexible conductor and an adhesive, said second lead having a first end connected to said circuit, having a portion connected to said package, and having a second end extending from said package.

3. The device of claim 2, further comprising at least one spacer positioned between said leads.

4. The device of claim 1, wherein said second end of said first lead is connected to said deformable structure.

5. A device comprising:
    a circuit;
    a package enclosing said circuit;
    a first lead formed from a flexible conductor and an adhesive, said first lead having a first end connected to said circuit, having a portion connected to said package, and having a second end extending from said package and attached to a substrate;
    at least a second lead formed from a flexible conductor and an adhesive, said second lead having a first end connected to said circuit, having a portion connected to said package, and having a second end extending from said package and attached to said substrate; and
    at least one spacer positioned between said package and at least one of said leads, said spacer including an adhesive and a resiliently deformable structure in contact with said package and said substrate.

6. The device of claim 5, further comprising at least one spacer positioned between said leads.

7. The device of claim 5, wherein said second end of said first lead is connected to said deformable structure.

8. A device comprising:
    a circuit;
    a package enclosing said circuit;
    a first lead formed from a flexible conductor and an adhesive, said first lead having a first end connected to said circuit, having a portion connected to said package, and having a second end extending from said package and attached to a substrate;
    at least a second lead formed from a flexible conductor and an adhesive, said second lead having a first end connected to said circuit, having a portion connected to said package, and having a second end extending from said package and attached to said substrate; and
    at least one spacer positioned between said leads, said spacer including an adhesive and a resiliently deformable structure in contact with said package and said substrate.

9. The device of claim 8, further comprising at least one spacer positioned between said package and at least one of said leads.

10. The device of claim 8, wherein said second end of said first lead is connected to said deformable structure.

* * * * *